(12) United States Patent
Djordjevic

(10) Patent No.: US 7,515,451 B2
(45) Date of Patent: Apr. 7, 2009

(54) MEMORY APPARATUS WITH A BUS ARCHITECTURE

(75) Inventor: Srdjan Djordjevic, München (DE)

(73) Assignee: Qimonda AG, Munich (DE)

( * ) Notice: Subject to any disclaimer, the term of this patent is extended or adjusted under 35 U.S.C. 154(b) by 2 days.

(21) Appl. No.: 11/856,892

(22) Filed: Sep. 18, 2007

(65) Prior Publication Data

US 2008/0071956 A1 Mar. 20, 2008

(30) Foreign Application Priority Data

Sep. 18, 2006 (DE) ........................ 10 2006 043 634

(51) Int. Cl.
*G11C 5/00* (2006.01)
(52) U.S. Cl. .................. 365/52; 365/230.03; 365/233.1
(58) Field of Classification Search .................. 365/52, 365/230.03, 233.1
See application file for complete search history.

(56) References Cited

U.S. PATENT DOCUMENTS

| 7,061,784 B2 | 6/2006 | Jakobs et al. |
| 2005/0174878 A1 | 8/2005 | Osaka et al. |
| 2007/0019494 A1* | 1/2007 | Moosrainer et al. ..... 365/230.03 |

* cited by examiner

*Primary Examiner*—Huan Hoang
(74) *Attorney, Agent, or Firm*—Edell, Shapiro & Finnan, LLC

(57) ABSTRACT

A system comprises a board, memory units that are arranged on the board, a control unit configured to control memory access to the memory units, at least one control/address bus configured to transmit control/address signals from the control unit to a first group of the memory units, and at least one clock bus configured to transmit a clock signal from the control unit to a second group of the semiconductor memory units. A length of the at least one control/address bus corresponds to the length of the at least one clock bus. The second group of memory units comprises fewer memory units than the first group of memory units.

25 Claims, 10 Drawing Sheets

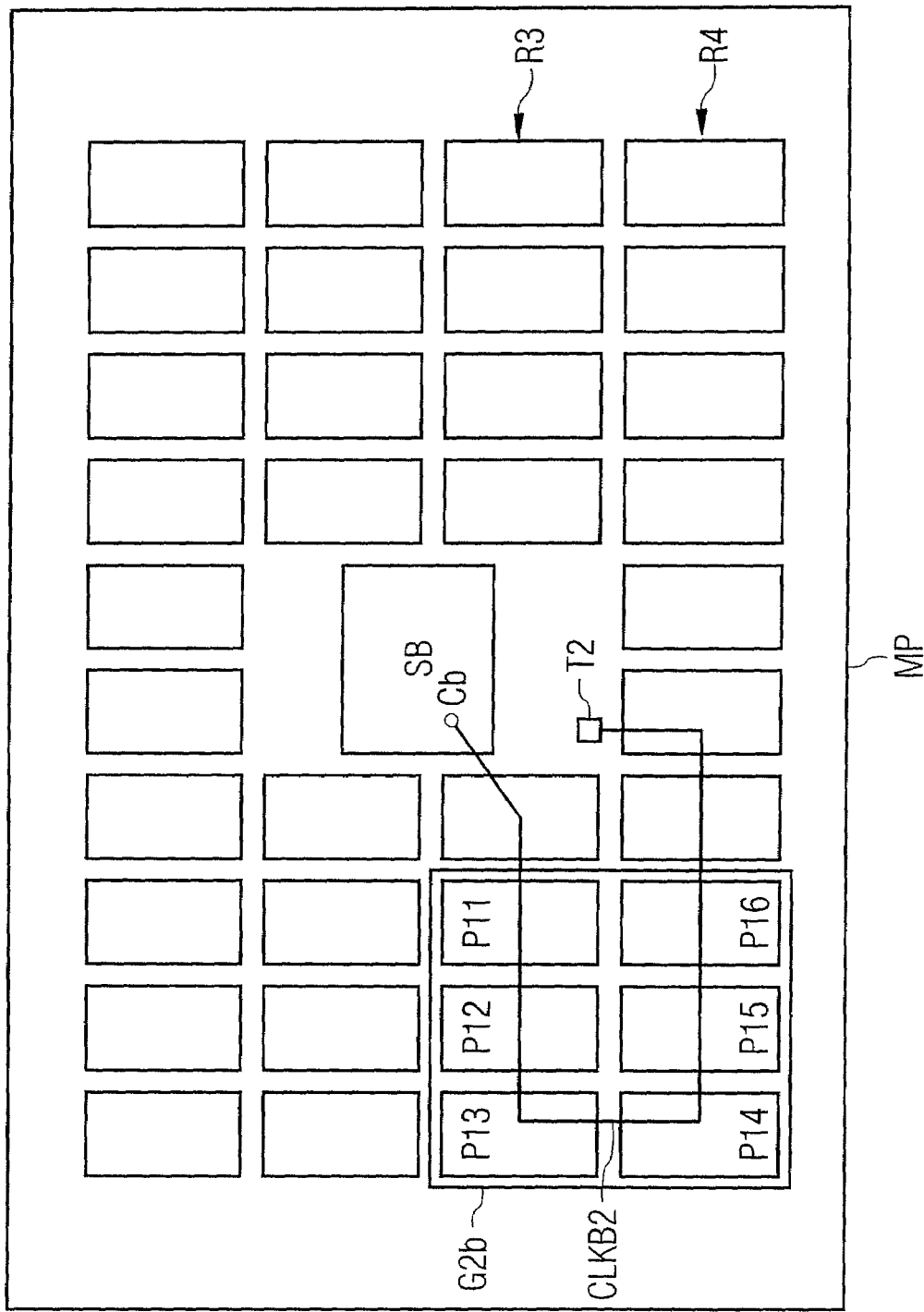

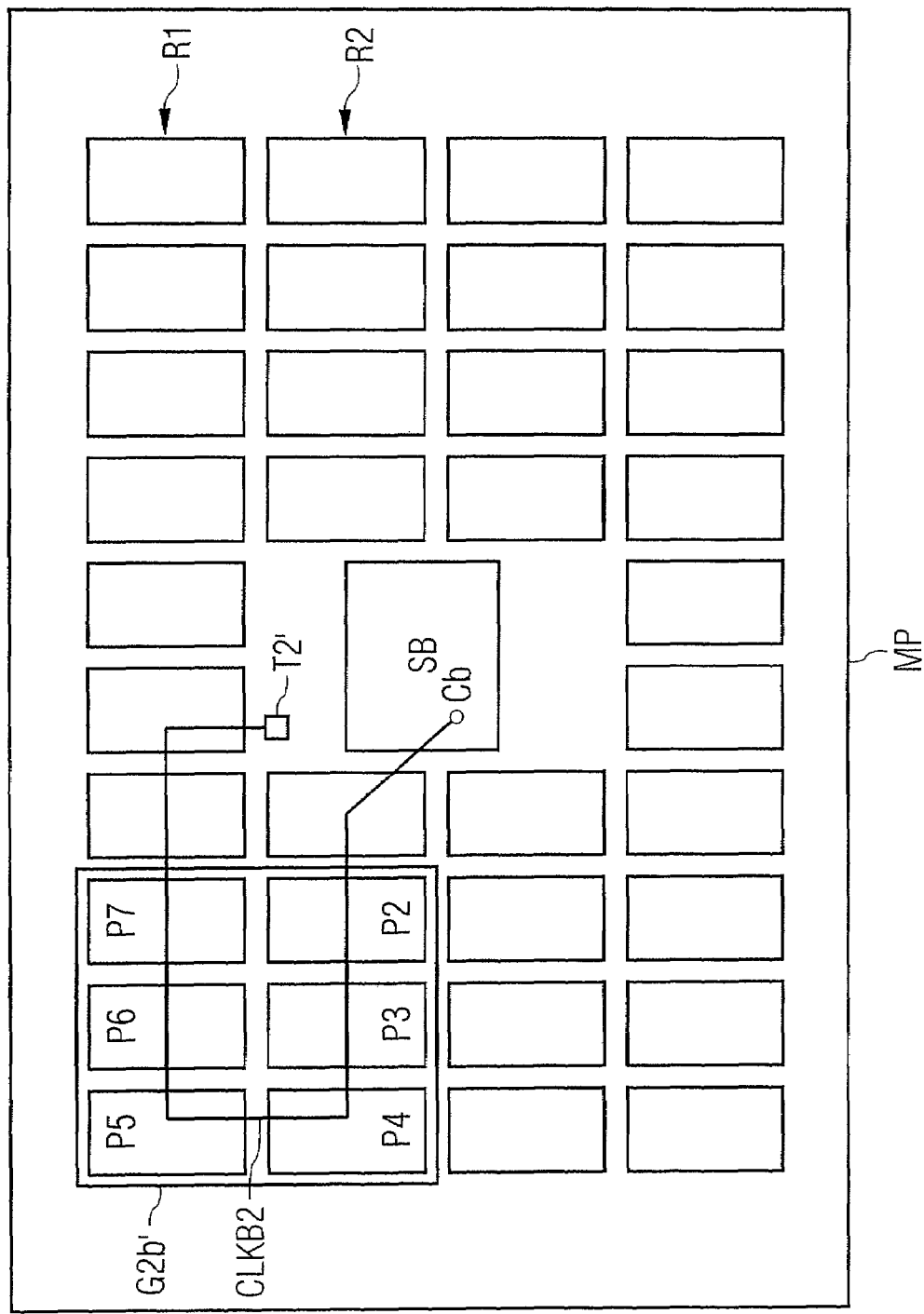

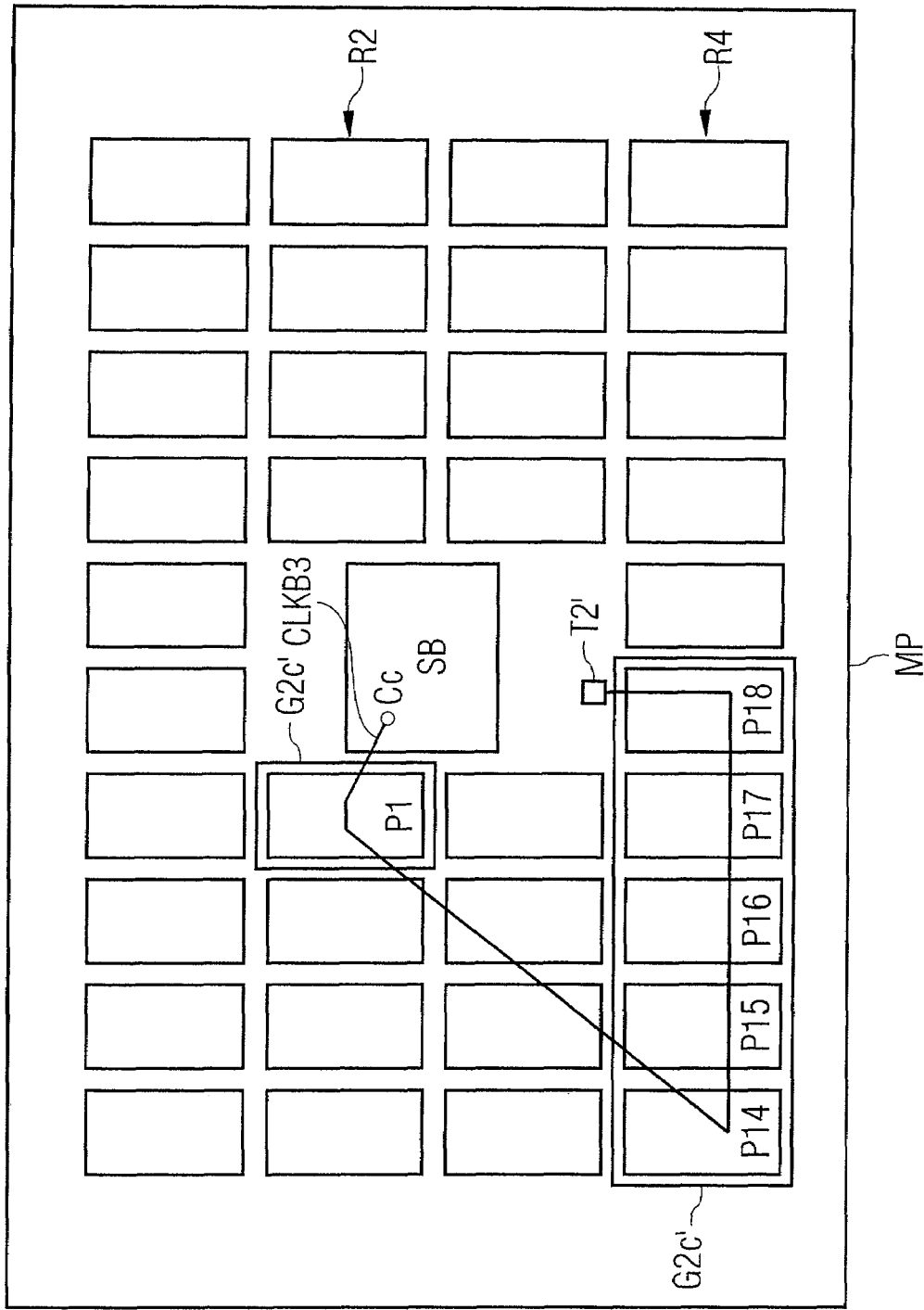

MEMORY APPARATUS WITH A BUS ARCHITECTURE

CROSS REFERENCE TO RELATED APPLICATIONS

This application claims priority under 35 U.S.C. §119 to Application No. DE 102006043634.2 filed on Sep. 18, 2006, entitled "Memory Apparatus Having a Bus Architecture," the entire contents of which are hereby incorporated by reference.

FIELD

The disclosure relates to a semiconductor memory apparatus having a bus architecture in which semiconductor memory units are connected by different buses to a control unit for controlling memory access operations to the semiconductor memory units.

BACKGROUND

A semiconductor memory apparatus, for example a semiconductor memory module, includes a plurality of semiconductor memory units on a board which communicate with a control unit by means of different buses. FIG. 1 shows a top side of a semiconductor memory module 1, for example a buffered DIMM (Dual In-Line Memory Module), in which semiconductor memory units P1, ..., P18 are arranged in a plurality of rows R1, R2, R3 and R4 to form a left-hand side L and a right-hand side R of a control unit SB. The control unit SB is positioned in the center of the board MP. In the case of a semiconductor memory module in the configuration 8R×4, the top side and underside of the module board respectively hold 36 memory units. Each of the memory units contains two memory chips in a stacked arrangement (dual stack), so that the memory module has a total of 144 memory chips.

FIG. 2 shows a simplified illustration of a memory chip 100a. The memory chip 100a comprises a memory cell array 10 which contains memory cells SZ along word lines WL and bit lines BL. In the case of DRAM (Dynamic Random Access Memory) memory cells, a memory cell has a selection transistor AT and a storage capacitor SC. In order to select one of the memory cells in the memory cell array 10, address signals are applied to an address connection A100 which is connected to an address register 30. In order to control read or write access operations, control signals are applied to a control connection S100 which is connected to a control circuit 20. For read access, the memory chip produces data which have been read from the memory cell array on a data connection D100. In the case of write access, the data connection D100 has data applied to it which are written to the memory cell array. The read and write access operations take place in sync with a clock signal which is applied to a clock connection C100 of the memory chip.

In order to control memory access operations, the memory chip is actuated by the control unit with the control/address signals via a control/address bus, known as the CA (Command Address) bus, and with the clock signal via a clock bus, known as the CLK bus.

It is desirable to provide a memory module with a suitable configuration or arrangement of CA and CLK buses connected with respective memory units that provides suitable signal integrity of the clock signal during read and write operations of the memory module.

SUMMARY

A system comprises a board, memory units that are arranged on the board, a control unit configured to control memory access to the memory units, at least one control/address bus configured to transmit control/address signals from the control unit to a first group of the memory units, and at least one clock bus configured to transmit a clock signal from the control unit to a second group of the semiconductor memory units. A length of the at least one control/address bus corresponds to (e.g., is the same or substantially the same as) the length of the at least one clock bus. The second group of memory units comprises fewer memory units than the first group of memory units.

By matching the length of the at least one clock bus to the length of the at least one control/address bus, it becomes possible to transmit the clock signal with a good level of signal integrity. In addition, the clock signals on the at least one clock bus are transmitted with a high edge gradient, since fewer semiconductor memory units are connected to the at least one clock bus than to the at least one control/address bus.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 4A shows a first embodiment of a second clock bus for transmitting a clock signal to semiconductor memory units on a board in a semiconductor memory apparatus.

FIG. 4B shows a second embodiment of a second clock bus for transmitting a clock signal to semiconductor memory units on an underside of a board in a semiconductor memory apparatus.

FIG. 5B shows a third embodiment of a second clock bus for transmitting a clock signal to semiconductor memory units on a board in a semiconductor memory apparatus.

DETAILED DESCRIPTION

A semiconductor memory module with a bus architecture is provided, in which the module comprises a module board, semiconductor memory units which are arranged on the module board, a control unit configured to control memory access to the semiconductor memory units, at least one control/address bus configured to transmit control/address signals from the control unit to a first group of the semiconductor memory units, and at least one clock bus configured to transmit a clock signal from the control unit to a second group of the semiconductor memory units. A length of the at least one control/address bus corresponds to the length of the at least one clock bus (e.g., the length of the control/address bus is substantially the same or the same as the length of the at least one clock bus). The second group of semiconductor memory units comprises fewer semiconductor memory units than the first group.

By matching the length of the at least one clock bus to the length of the at least one control/address bus, it becomes possible to transmit the clock signal with a good level of signal integrity. In addition, the clock signals on the at least one clock bus are transmitted with a high edge gradient, since fewer semiconductor memory units are connected to the at least one clock bus than to the at least one control/address bus.

Figure 1:
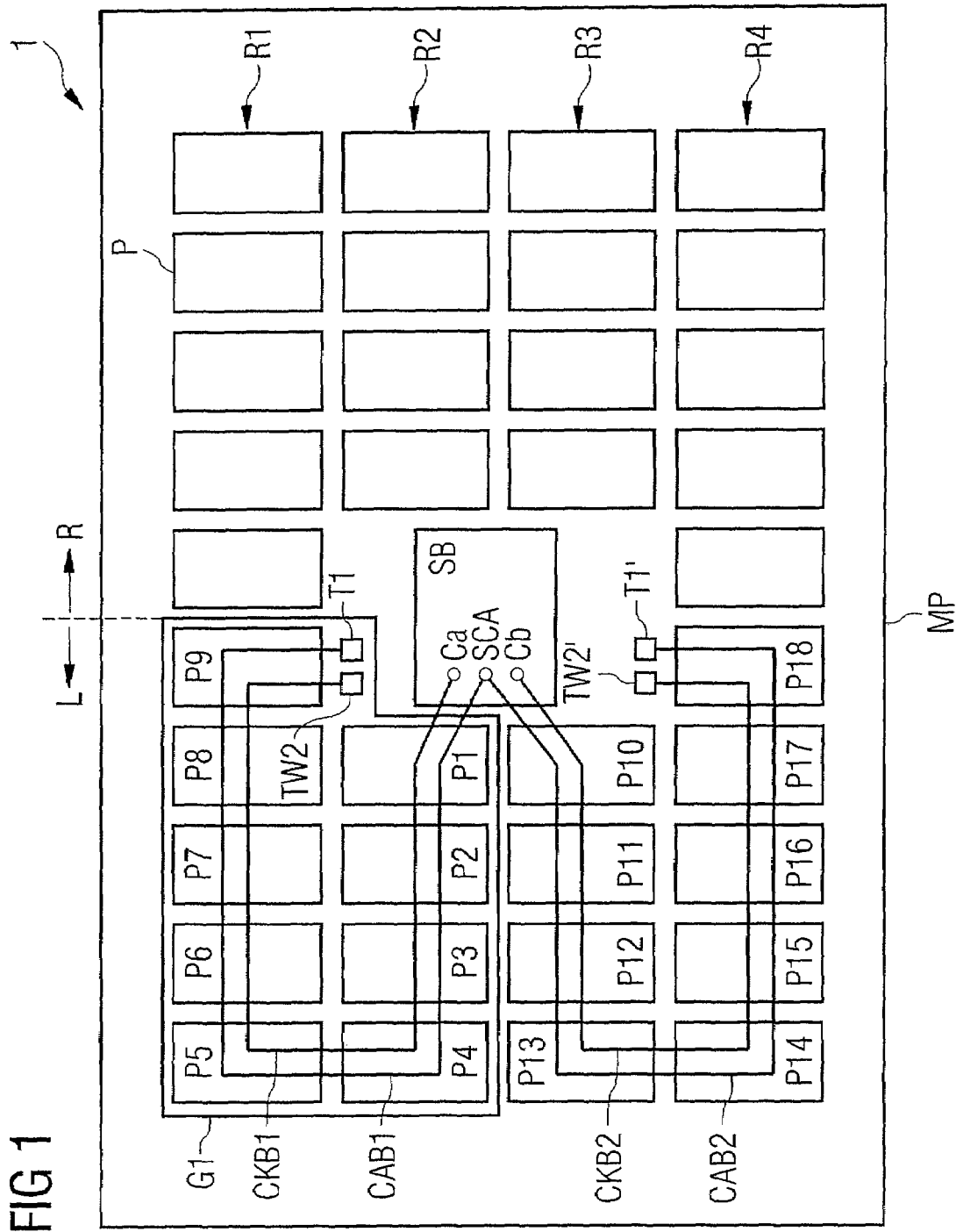
FIG. 1 shows an embodiment of a semiconductor memory apparatus in which semiconductor memory units are connected by means of clock and control/address buses to a control unit.
Figure 2:
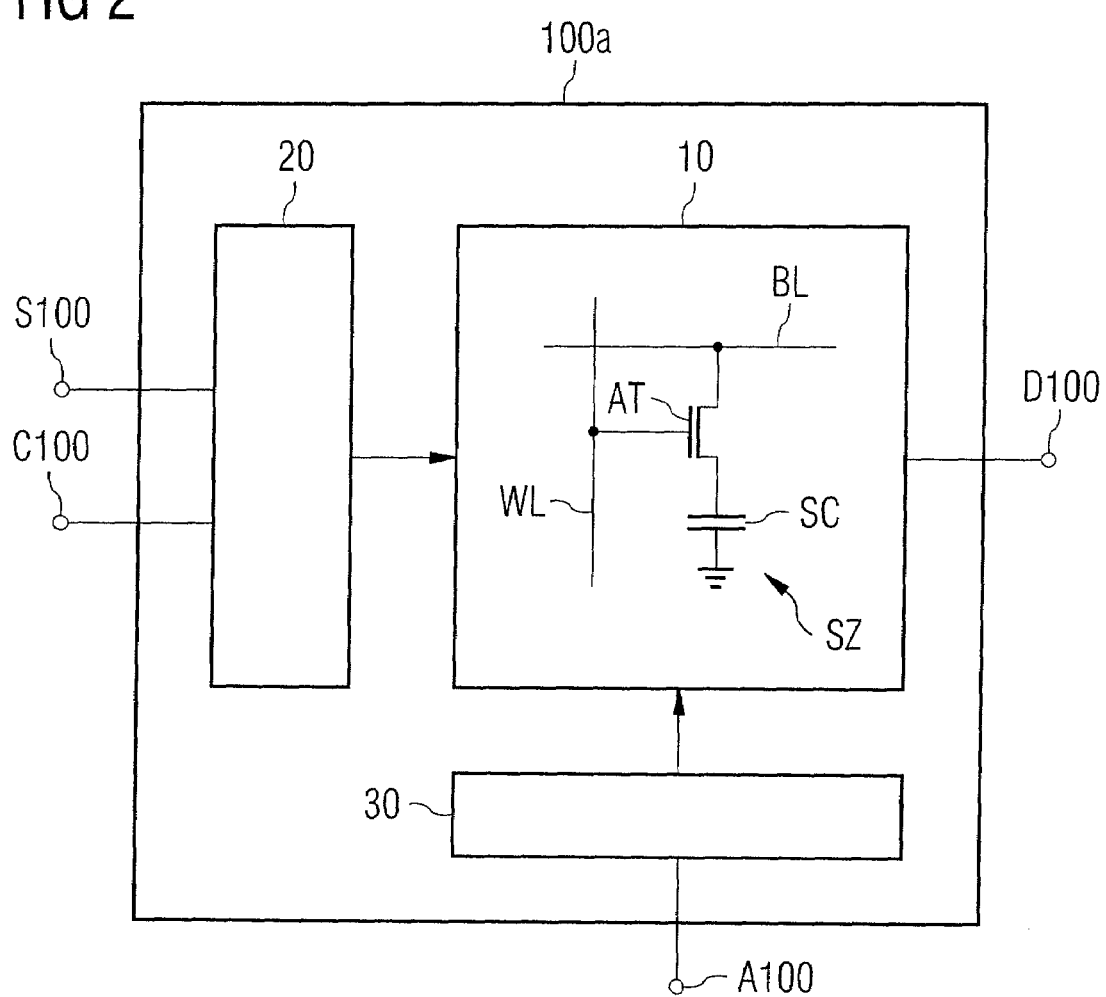
FIG. 2 shows an embodiment of a memory chip which is arranged in one of the semiconductor memory units.

An embodiment of control/address buses CAB1, CAB2 and clock buses CLKB1, CLKB2 is shown in FIG. 1. The control unit SB has a control connection SCA to which the control/address bus CAB1 and the control/address bus CAB2 are connected. The control/address buses are used to control respective control and address data for the purpose of controlling read and write access to the memory chips in the semiconductor memory units.

In the example in FIG. 1, the semiconductor memory units P1, . . . , P9 are connected to the control unit SB by means of the control/address bus CAB1. The length of the control/address bus CAB1 extends from the control connection SCA to a terminating resistor T1. The semiconductor memory units P10, . . . , P18 are connected to the control unit by means of the control/address bus CAB2, the control unit likewise extending from the control connection SCA to a terminating resistor T1'.

In addition, the semiconductor memory units P1, . . . , P9 are connected to the control unit SB by means of a clock bus CKB1 for transmitting the clock signal. The clock bus CKB1 extends from a clock connection Ca of the control unit SB to a terminating resistor TW2. The semiconductor memory units P10, . . . , P18 are connected to the control unit SB by means of a clock bus CKB2. The clock bus CKB2 extends from a clock connection Cb to a terminating resistor TW2'. For reasons of better clarity, the buses which connect the semiconductor memory units on the right-hand side R of the memory module to the control unit SB have not been shown.

To attain good signal integrity for the transmission of signals via the clock bus CKB1 and the control/address bus CAB1 and also via the clock bus CKB2 and the control/address bus CAB2, it is necessary for the buses, which are connected to the same semiconductor memory units, to be of approximately the same length. The clock bus CKB 1 should therefore be of approximately or substantially the same length or the same length as the control/address bus CAB1, and the clock bus CKB2 should be of approximately or substantially the same length or the same length as the control/address bus CAB2.

In the case of a semiconductor memory module from the DDR2 or DDR3 generation, the control unit SB has a maximum of six clock connections for coupling clock buses to the control unit. In this case, three of the clock connections are provided for connecting semiconductor memory units which are arranged on the left-hand side L on the top side and underside of the module board, and three of the clock connections are provided for connecting semiconductor memory units which are arranged on the right-hand side R on the top side and underside of the module board.

In the case of the arrangement of a memory module in the configuration 8R×4 which is shown in FIG. 1, however, it would be necessary to have four clock connections provided for connecting clock buses on the left-hand side of the memory module and four clock connections provided for connecting semiconductor memory units on the right-hand side of the module board so that the clock buses are of the same length as the control/address buses. As FIG. 1 shows, each side of the control unit would require two clock connections for connecting the semiconductor memory units on the top side and two clock connections for connecting the semiconductor memory units on the underside of the module board. However, the control unit SB shown in FIG. 1 has only three clock connections on the left-hand and right-hand sides.

Figure 3A:
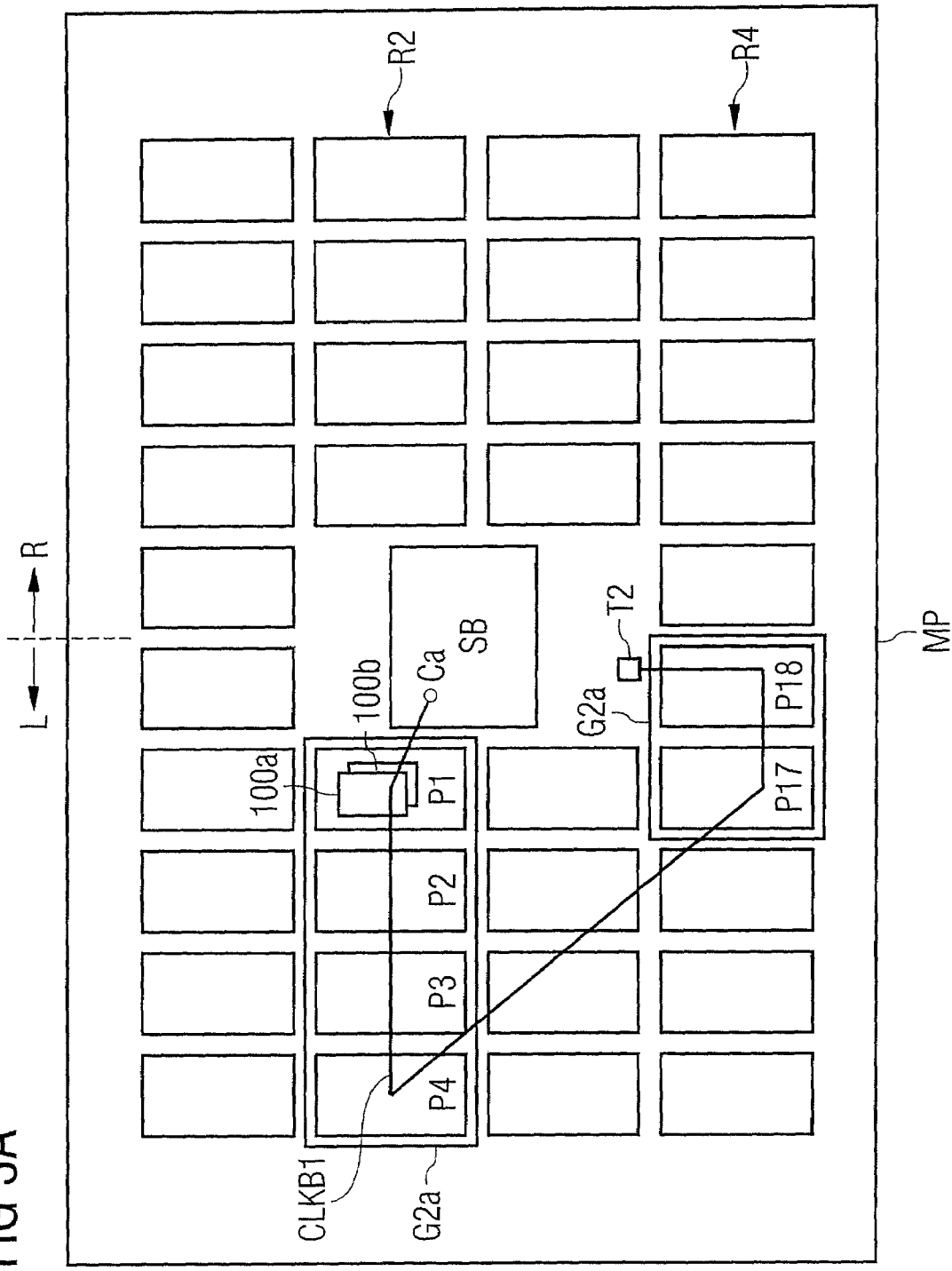
FIG. 3A shows a first embodiment of a first clock bus for transmitting a clock signal to semiconductor memory units on a board in a semiconductor memory apparatus.

FIG. 3A shows the module board MP from FIG. 1 with a group G2a of semiconductor memory units P1, P2, P3, P4, P17 and P18. Thus, the semiconductor memory units P1, P2, P3, P4 in the row R2 and the semiconductor memory units P17 and P18 in the row R4 are connected to the control unit SB by means of a clock bus CLKB1. The clock bus CLKB1 extends from a clock connection Ca of the control unit to a terminating resistor T2. Equally, the clock bus CLKB1 has six semiconductor memory units connected to it on an underside of the module board, with the semiconductor memory units on the underside being opposite the semiconductor memory units P1, P2, P3, P4, P17 and P18 on the top side of the module board.

Figure 3B:
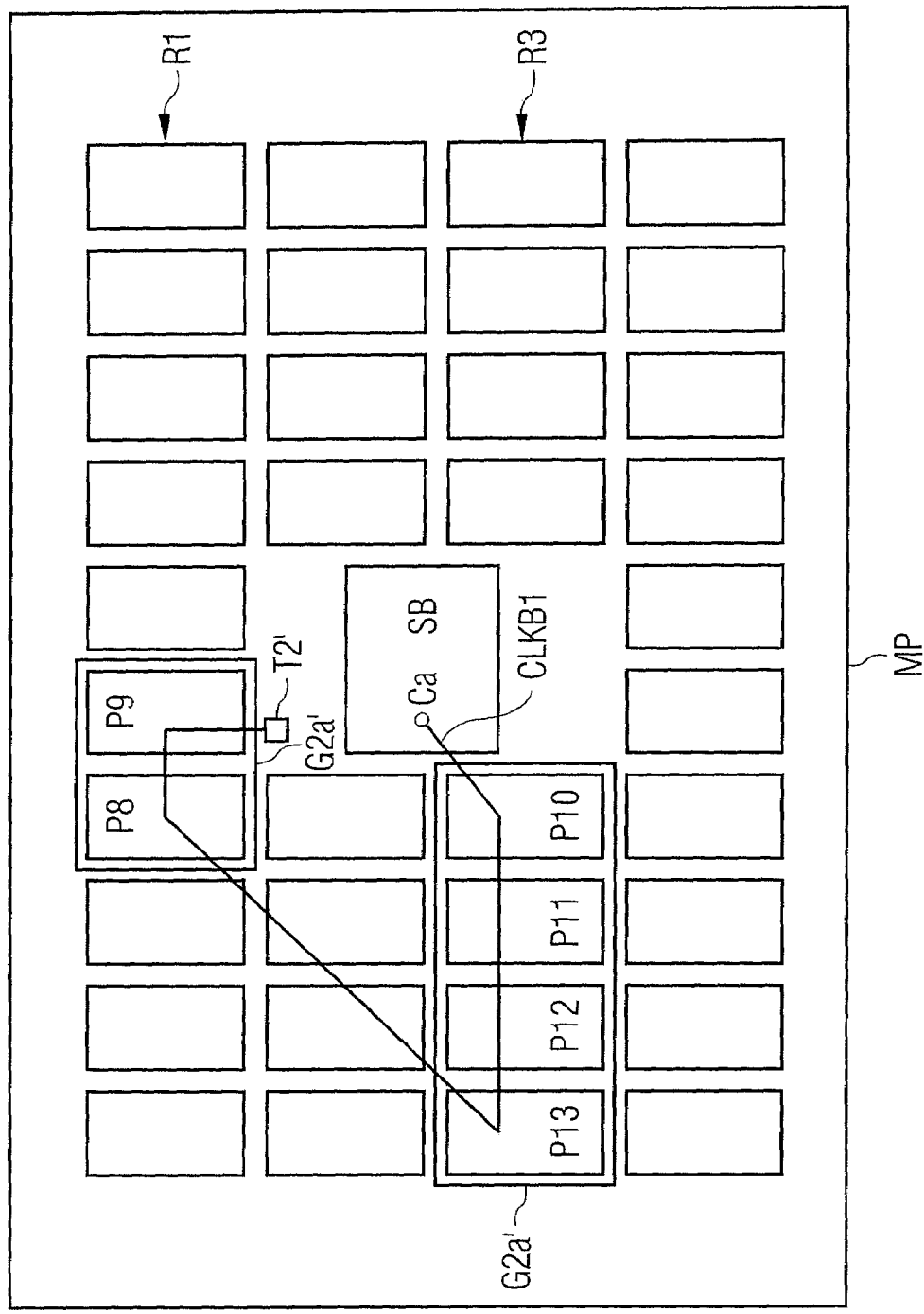
FIG. 3B shows a second embodiment of a first clock bus for transmitting a clock signal to semiconductor memory units on a board in a semiconductor memory apparatus.

FIG. 3B shows another embodiment of the clock bus CLKB1. In this embodiment, the clock bus CLKB1 is connected to the semiconductor memory units P8, P9 in the row R1 and to the semiconductor memory units P10, P11, P12 and P13 in the row R3 on a top side of the module board. The semiconductor memory units are part of a group G2a'. Equally, the clock bus CLKB 1 has six semiconductor memory units connected to it on the underside of the module board, with the semiconductor memory units on the underside being opposite the semiconductor memory units on the top side of the module board. In this embodiment, the clock bus CLKB1 extends from the clock connection Ca to the terminating resistor T2'. In the embodiment shown in FIGS. 3A and 3B, the clock bus CLKB1 is in a form such that the length of the bus between the clock connection Ca of the control unit and the terminating resistor T2 or T2' corresponds to the length of the respective control/address buses CAB1 and CAB2 in FIG. 1 (e.g., the length of clock bus CLKB1 is substantially the same or the same as the length of the respective control/address bus CAB1 or CAB2).

FIG. 4A shows a top side of the module board MP with a group G2b of semiconductor memory units P11, P12, P13, P14, P15 and P16. The semiconductor memory units P11, P12 and P13 are arranged in a row R3. The semiconductor memory units P14, P15 and P16 are arranged in a row R4. All the semiconductor memory units in the group G2b are connected to the control unit SB by means of a common clock bus CLKB2. Equally, the clock bus CLKB2 has six semiconductor memory units connected to it on the underside of the module board, with the semiconductor memory units on the underside being opposite the semiconductor memory units on the top side of the module board. The clock bus CLKB2 extends from a clock connection Cb to a terminating resistor T2.

FIG. 4B shows another embodiment of the clock bus CLKB2. The clock bus CLKB2 is connected to a group G2b' of semiconductor memory units P2, P3, P4, P5, P6 and P7 on the top side of the module board. The semiconductor memory units P2, P3 and P4 are arranged in a row R2. The semiconductor memory units P5, P6 and P7 are arranged in a row R4. Equally, the clock bus CLKB2 has six semiconductor memory units connected to it on the underside of the module board, with the semiconductor memory units on the underside being opposite the semiconductor memory units on the top side of the module board. The clock bus CLKB2 extends from the clock connection Cb of the control unit to the terminating resistor T2'. In the embodiments shown in FIGS. 4A and 4B, the clock bus CLKB2 is in a form such that its length between the clock connection Cb of the control unit and the terminating resistor T2 or T2' corresponds to (e.g., is substantially the same or the same as) the length of the respective control/address bus CAB1 or CAB2.

Figure 5A:
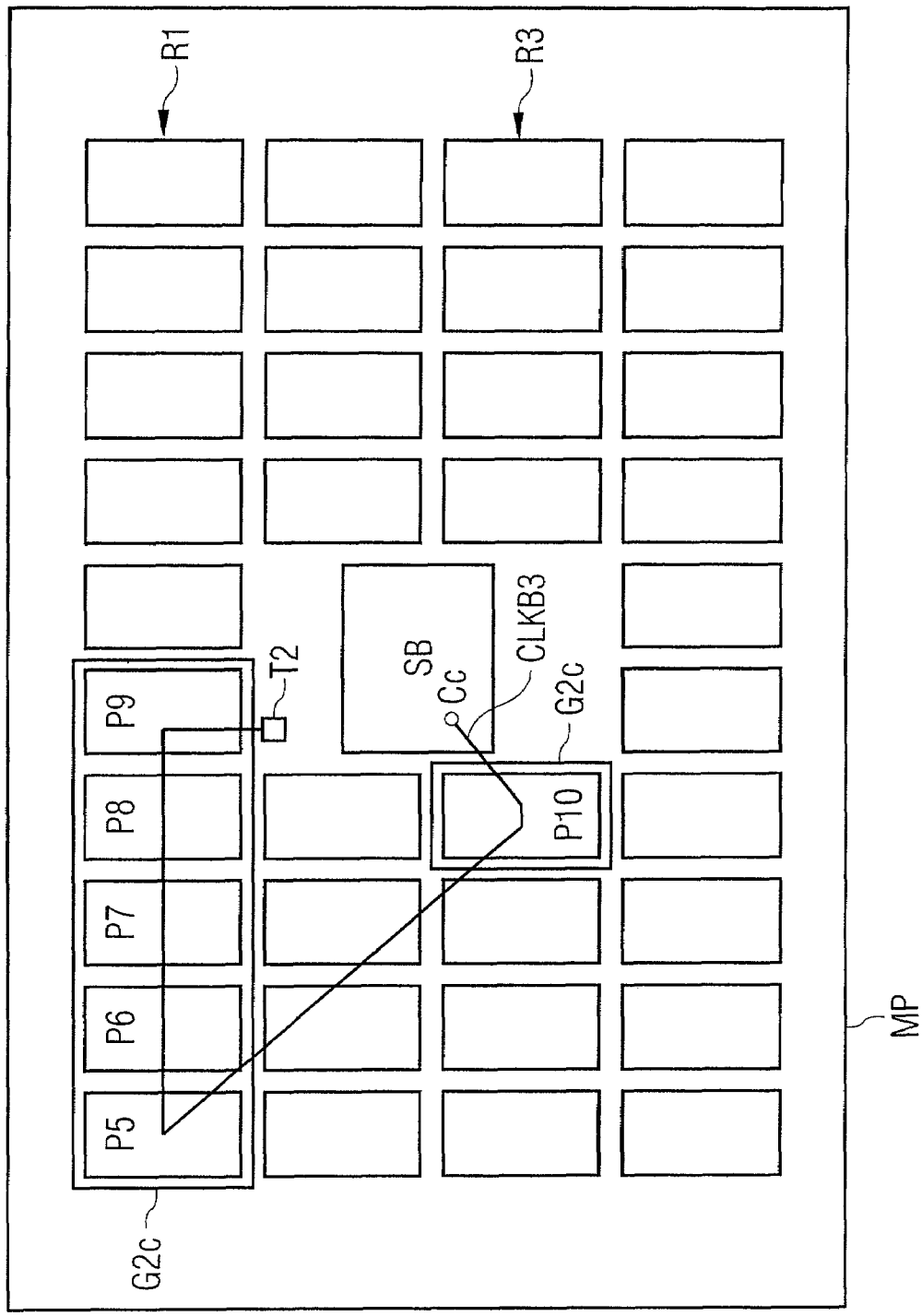
FIG. 5A shows a third embodiment of a first clock bus for transmitting a clock signal to semiconductor memory units on a board in a semiconductor memory apparatus.

FIG. 5A shows a group G2c of semiconductor memory units P5, P6, P7, P8, P9 and P10 which are arranged on a top side of the module board and are connected to a clock bus CLKB3. In this arrangement, the clock bus CLKB3 connects the semiconductor memory units P5, . . . , P9, which are arranged in a row R1 on the module board, and the semiconductor memory unit P10, which is arranged in a row R3 on the module board, to a clock connection Cc of the control unit SB. Equally, the clock bus CLKB3 has six semiconductor memory units connected to it on the underside of the module board, with the semiconductor memory units on the underside being opposite the semiconductor memory units on the top side of the module board. The clock bus CLKB3 extends from the clock connection Cc to the terminating resistor T2.

FIG. 5B shows another embodiment of the clock bus CLKB3, which is connected to a group G2c' of semiconductor memory units. The semiconductor memory units in the group G2c' include the semiconductor memory units P1, P14, P15, P16, P17 and P18, with the semiconductor memory unit P1 being arranged in a row R2 and the semiconductor memory units P14, . . . , P18 being arranged in a row R4. Equally, the clock bus CLKB3 has six semiconductor memory units connected to it on the underside of the module board, with the semiconductor memory units on the underside being opposite the semiconductor memory units on the top side of the module board. The clock bus CLKB3 extends from the clock connection Cc of the control unit 5B to the terminating resistor T2'. In the embodiment shown in FIGS. 5A and 5B, the clock bus CLKB3 is in a form such that its length corresponds to (e.g., is substantially the same or the same as) the length of the control/address buses CAB1 and CAB2.

The arrangement and form of the buses CLKB1, CLKB2 and CLKB3 as shown in FIGS. 3A to 5B allows the bus length of the clock buses to be matched to the bus length of the control/address buses. In this case, all the clock connections on each side of the control unit are used to couple the clock buses. The coupling of the semiconductor memory units on the right-hand side R of the semiconductor memory module is performed in symmetry with the coupling of the semiconductor memory units on the left-hand side L of the semiconductor memory module.

Another option for matching the length of the clock buses to the length of the control/address buses in a semiconductor memory module in the module configuration 8R×4 involves using, from the six clock connections of the control unit, two clock connections on the left-hand side and two clock connections on the right-hand side, respectively. In this case, by way of example, the clock bus CKB1 in FIG. 1 has the semiconductor memory units P1, . . . , P9 connected to it on the top side and further semiconductor units connected to it on the underside, these being opposite the semiconductor memory units P1, . . . , P9. The clock bus CKB2 has the semiconductor memory units P10, . . . , P18 connected to it on the top side O of the module board. Accordingly, the semiconductor memory units which are opposite the semiconductor memory units P10, . . . , P18 on the underside of the module board are likewise connected to the clock bus CKB2.

With such a structure for the clock buses, only the two clock connections Ca and Cb from the total of three available clock connections Ca, Cb and Cc on each side of the control unit SB are used. In the case of the module configuration 8R×4, in which each semiconductor unit contains two memory chips, each clock bus then has a total of 36 memory chips connected to it. By contrast, in the case of the embodiment of the clock buses which is shown in FIGS. 3 to 5, only 24 memory chips are respectively connected to the clock buses. On account of the lower load to be driven, the signal integrity and the edge gradient in the case of the embodiment of the clock buses which is shown in FIGS. 3 to 5 are therefore improved over an arrangement of the clock buses in which only two of the available three clock connections are respectively used on each side of the control unit.

Figure 6A:
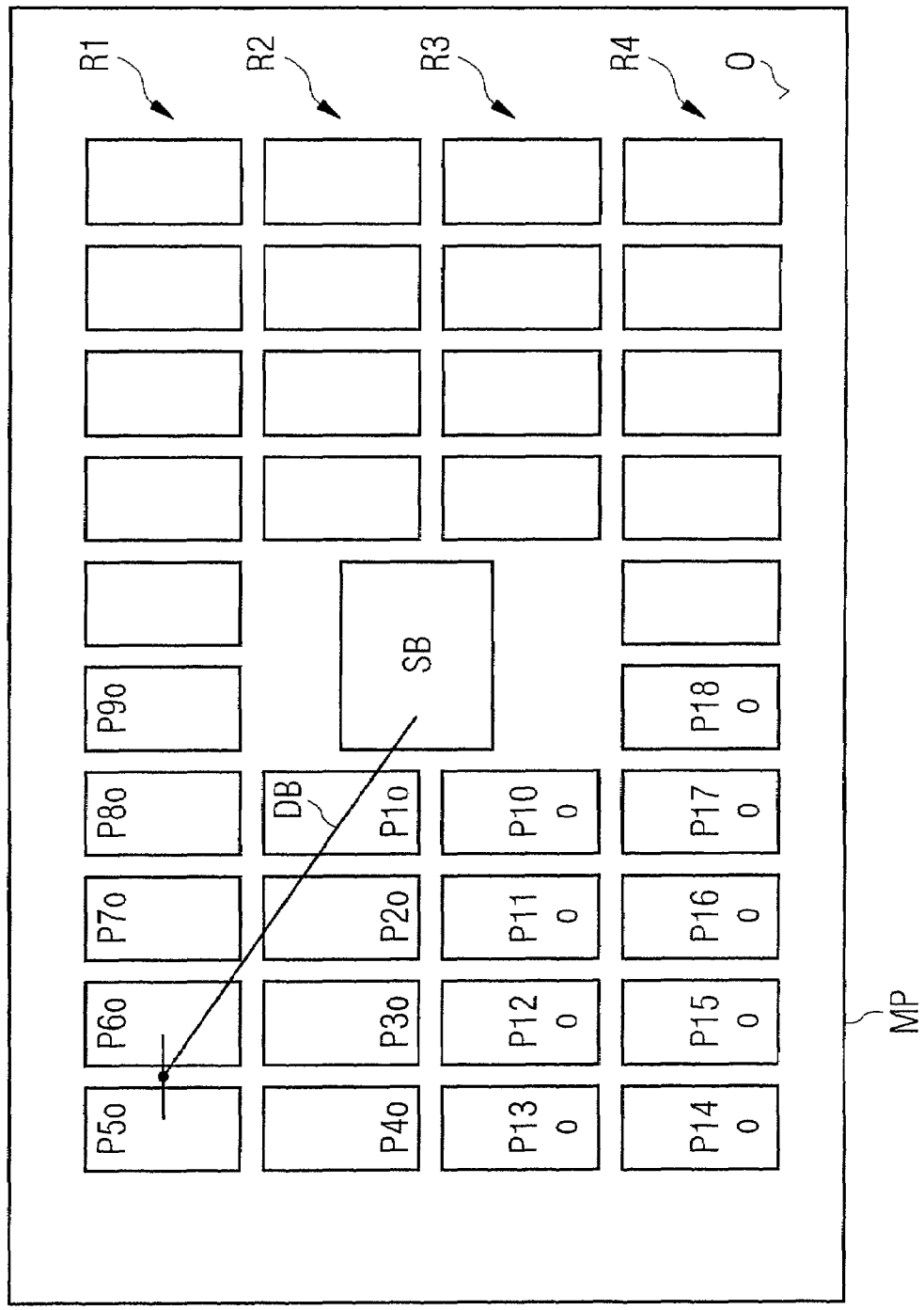
FIG. 6A shows an embodiment of a data clock bus for transmitting data signals to semiconductor memory units on a top side of a board in a semiconductor memory apparatus.
Figure 6B:
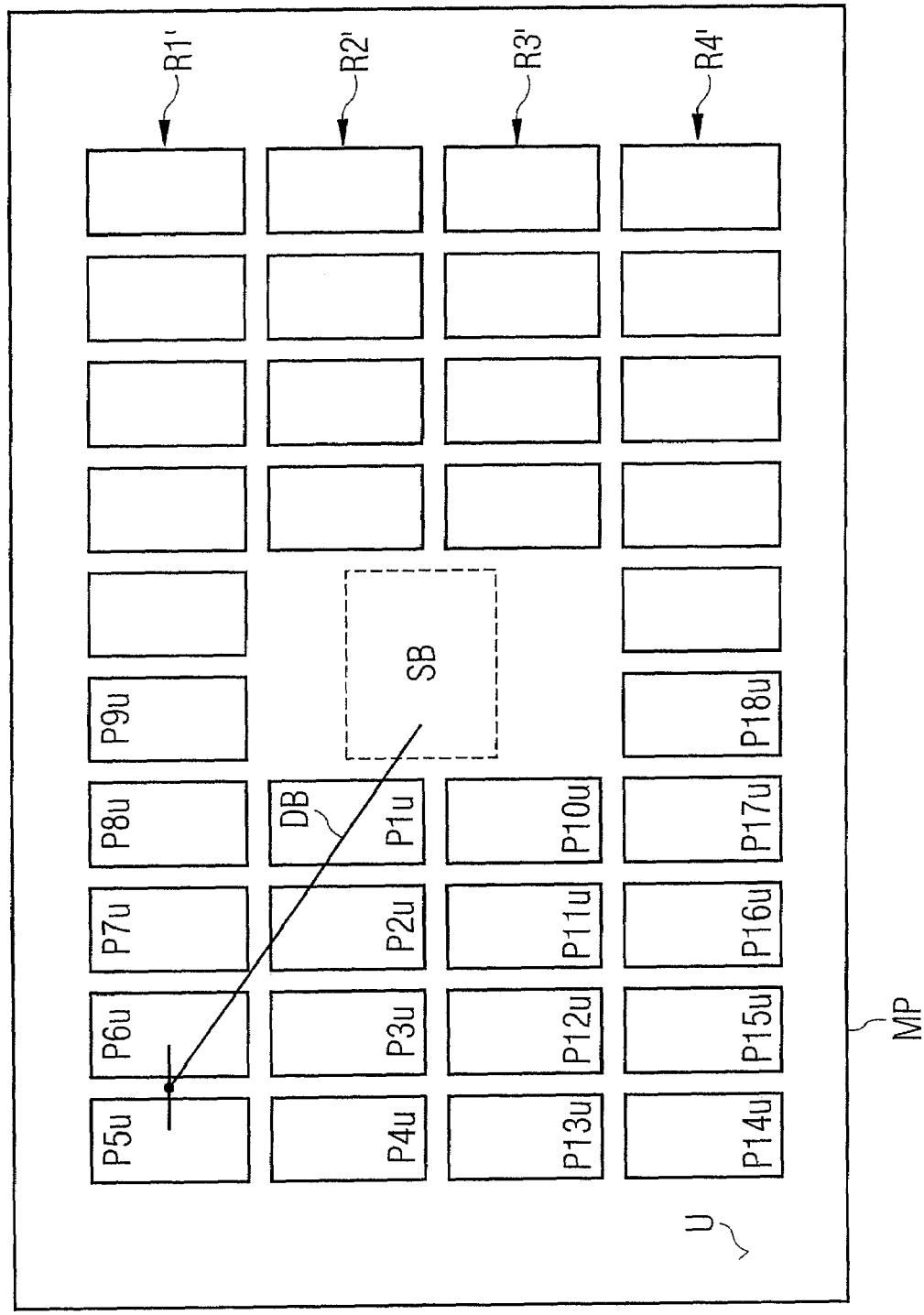
FIG. 6B shows an embodiment of a data clock bus for transmitting data signals to semiconductor memory units on an underside of a board in a semiconductor memory apparatus.

FIGS. 6A and 6B show coupling of semiconductor memory units P5o and P6o, which are arranged on a top side 6 of the module board, and coupling of semiconductor memory units P5u and P6u, which are arranged on an underside U of the module board, to a data clock bus DB for transmitting a data clock signal for a module configuration 8R×4. Upon rising and falling edges of the data clock signal, data are respectively read into the memory cell array of the memory chips or are read from the memory cell array. The semiconductor memory units are arranged on the module board MP such that semiconductor memory units belonging to different ranks are respectively arranged next to one another in the rows R1, . . . , R4.

Equally, the memory chips which are arranged in the semiconductor memory units likewise belong to different ranks. If each of the semiconductor memory units in FIGS. 6A and 6B contains two respective memory chips then the data clock bus DB connected to the semiconductor memory units P5o and P6o on the top side O of the module board and to the semiconductor memory units P5u and P6u on the underside of the module board can be used to couple eight memory chips belonging to different ranks. In conjunction with the embodiments of the clock buses CLKB1, CLKB2 and CLKB3 which are shown in FIGS. 3 to 5, the embodiment of the data clock bus which is shown in FIGS. 6A and 6B makes it possible for the propagation time for a clock signal on the clock buses to match the propagation time of a data clock signal on the data clock buses.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A system with a bus architecture, the system comprising:
 a board;
 a plurality of memory units arranged on the board;

a control unit configured to control memory access to the memory units;

at least one control/address bus configured to transmit control/address signals from the control unit to a first group of the memory units; and at least one clock bus configured to transmit a clock signal from the control unit to a second group of the semiconductor memory units;

wherein a length of the at least one control/address bus is substantially the same as a length of the at least one clock bus, and the second group comprises fewer memory units than the first group.

2. The system of claim 1, wherein the second group of memory units includes at least one memory unit that is not contained in the first group of memory units.

3. The system of claim 1, wherein the memory units are arranged in a plurality of rows on the board, with the second group of memory units containing at least one memory unit that is arranged in a different row than the rows which contain the first group of memory units.

4. The system of claim 3, wherein the first group comprises memory units that are arranged in different rows, the different rows of the first group of memory units being disposed a vertically oriented arrangement with respect to each other on the board, and the second group comprises memory units that are arranged in different rows on the board.

5. The system of claim 3, wherein the second group comprises first memory units, with four of the first memory units being contained in one row and two of the first memory units being contained in another row.

6. The system of claim 3, wherein the second group comprises second memory units, with three of the second memory units being contained in one row and three of the second memory units being contained in another row.

7. The system of claim 3, wherein the second group comprises further memory units, with five of the further memory units being contained in one row and one of the further memory units being contained in another row.

8. The system of claim 1, wherein each of the at least one control/address bus and the at least one clock bus extend from a respective output connection of the control unit to a respective resistor.

9. The system of claim 1, wherein the control unit comprises at least three clock connections on each side of the control unit, the first memory units are connected by a first clock bus to a first clock connection, the second memory units are connected by a second clock bus to a second clock connection, and third memory units are connected by a third clock bus to a third clock connection.

10. The system of claim 9, wherein each of the memory units includes two respective memory chips, with each of the memory chips comprising a memory cell array including memory cells configured to store a respective data item, and each of the clock buses includes 24 respective memory chips connected to the clock bus.

11. The system of claim 10, wherein the control/address bus includes 72 memory chips connected to the control/address bus.

12. The system of claim 1, further comprising:

a data clock bus configured to transmit data clock signals between the control unit and the memory units for writing data to memory cells in memory chips of the memory units and for reading data from the memory cells in the memory chips of the memory units;

wherein the data clock bus is connected to memory units that are arranged next to one another on the board, with respective memory chips of the memory units being arranged next to one another and belonging to different ranks.

13. The system of claim 1, wherein the system is in the form of a memory module in the configuration 8R×4.

14. A memory module with a bus architecture, the memory module comprising:

a module board;

a plurality of memory units arranged on the module board;

a control unit configured to control memory access to the memory units;

at least one control/address bus configured to transmit control/address signals from the control unit to a first group of the memory units; and at least one clock bus configured to transmit a clock signal from the control unit to a second group of the memory units;

wherein a length of the at least one control/address bus is substantially the same as a length of the at least one clock bus, and the second group of memory units includes at least one memory unit that is not contained in the first group of memory units.

15. The memory module of claim 14, wherein the second group comprises fewer memory units than the first group.

16. The memory module of claim 14, wherein the memory units are arranged in a plurality of rows on the module board, with the second group of memory units containing at least one memory unit that is arranged in a different row than the rows which contain the first group of memory units.

17. The memory module as claimed in claim 16, wherein the first group comprises memory units that are arranged in different rows, the different rows of the first group of memory units being disposed a vertically oriented arrangement with respect to each other on the module board, and the second group comprises memory units that are arranged in different rows on the module board.

18. The memory module of claim 16, wherein the second group comprises first memory units, with four of the first memory units being contained in one row from the plurality of rows and two of the first memory units being contained in another row from the plurality of rows.

19. A memory module with a bus architecture, the memory module comprising:

a module board;

a plurality of memory units that are arranged on the module board;

a control unit configured to control memory access to the memory units;

at least one control/address bus configured to transmit control/address signals from the control unit to a first group of the memory units; and at least one clock bus configured to transmit a clock signal from the control unit to a second group of the memory units;

wherein a length of the at least one control/address bus is substantially the same as a length of the at least one clock bus, and the memory units are arranged in a plurality of rows on the module board with the second group of memory units containing at least one memory unit that is arranged in a different row than the rows which contain the first group of memory units.

20. The memory module of claim 19, wherein the second group of memory units comprises fewer memory units than the first group of memory units.

21. The memory module as claimed in claim 19, wherein the first group comprises memory units that are arranged in different rows, the different rows of the first group of memory units being disposed a vertically oriented arrangement with respect to each other on the module board, and the second group comprises memory units that are arranged in different rows on the module board.

22. The memory module of claim 19, wherein the second group comprises first memory units, with four of the first memory units being contained in one row from the plurality of rows and two of the first memory units being contained in another row from the plurality of rows.

23. The memory module of claim 19, wherein the second group comprises second memory units, with three of the second memory units being contained in one row from the plurality of rows and three of the second memory units being contained in another row from the plurality of rows.

24. The memory module of claim 19, wherein the second group comprises third memory units, with five of the third memory units being contained in one row from the plurality of rows and one of the third memory units being contained in another row from the plurality of rows.

25. The memory module of claim 19, wherein the memory module is in the form of a memory module in the configuration 8R×4.

* * * * *